United States Patent [19]
O'Neil

[11] Patent Number: 5,644,384
[45] Date of Patent: Jul. 1, 1997

[54] REINFORCING, ADJUSTABLE, SERVICEABLE HINGE ASSEMBLY FOR PHOTOIMAGING APPARATUS AND A METHOD FOR MAKING SAME

[76] Inventor: Lawrence O'Neil, 741 S. Main St., Bellingham, Mass. 02019

[21] Appl. No.: 423,830

[22] Filed: Apr. 19, 1995

[51] Int. Cl.⁶ ............................ G03B 27/58; G03B 27/04
[52] U.S. Cl. .............................. 355/72; 355/122; 355/128
[58] Field of Search .................................. 355/72, 75, 122, 355/128, 129, 131; 16/225, 247, 254; 428/38

[56] References Cited

U.S. PATENT DOCUMENTS

| | | | |
|---|---|---|---|
| 2,241,101 | 5/1941 | Teeter | 16/225 X |
| 2,526,129 | 10/1950 | Groesbeck et al. | 16/225 |
| 2,538,429 | 1/1951 | Schantz | 16/225 X |
| 3,441,975 | 5/1969 | Shepherd | 16/225 |
| 4,412,739 | 11/1983 | Freiberg | 355/444 |
| 4,446,184 | 5/1984 | Bowser | 428/57 |
| 4,575,229 | 3/1986 | Lundstrom | 355/72 |
| 4,584,216 | 4/1986 | Kenworthy et al. | 428/38 |
| 4,600,298 | 7/1986 | Emmert | 355/75 |
| 4,896,188 | 1/1990 | Byers | 355/72 |
| 4,948,539 | 8/1990 | Byers | 264/22 |
| 5,014,087 | 5/1991 | Byers | 355/72 |
| 5,072,257 | 12/1991 | Stoesser et al. | 355/93 |

*Primary Examiner*—Fred L. Braun
*Attorney, Agent, or Firm*—Richard H. Kosakowski

[57] ABSTRACT

A hinged photoimaging apparatus used in photoimaging processes including a pair of rigid plates joined by upper and lower hinge plates separated by a spacer plate, the upper and lower hinge plates joining a flexible polymeric hinge. The hinge and spacer plates are provided in various shapes to reinforce the rigid plates.

15 Claims, 6 Drawing Sheets

5,644,384

REINFORCING, ADJUSTABLE, SERVICEABLE HINGE ASSEMBLY FOR PHOTOIMAGING APPARATUS AND A METHOD FOR MAKING SAME

FIELD OF THE INVENTION

The present invention relates generally to the art of producing printed circuits and the like by photoimaging processes, and relates more particularly to a photoimaging apparatus comprising a pair of transparent plates joined by a hinge assembly which provides improved reliability by reducing the incidence of plate breakage, and facilitates adjustability and serviceability. A method for making the hinge assembly is further included.

BACKGROUND OF THE INVENTION

A printed circuit board comprises a substrate of insulator material and a circuit pattern of conductive material commonly formed by photoimaging processes. For example, a fiberglass board to be printed with circuitry is plated with copper and laminated with a layer of photoresist material, a photosensitive polymer. The coated surface is then exposed to actinic radiation through a film with some areas which are transparent to the actinic radiation and some areas which are not, to define the desired circuit pattern. The pattern is developed as a relief image in the photoresist by solvent treatment, the exposed and unexposed portions of the photosensitive polymer having different solubilities. The printed substrate may be either a positive or negative image of the film depending on whether a positive or negative working photopolymer is used. Typically, the unexposed photoresist is removed and the underlying copper etched away to leave a pattern of conductive copper in the image of the transparent pattern on the film.

Photoimaging apparatus such as for the manufacture of printed circuits typically include glass plates and/or film coated with photographic emulsion, iron oxide or chromium films having a pattern of transparent and opaque areas with respect to actinic radiation. The aligned apparatus is exposed to actinic radiation which passes through the transparent areas of the image to photographically impose a pattern on the coated substrate, which is typically developed as a relief image by dissolution of the unexposed photosensitive material. In the alternative, the exposed coating material may be removed by dissolution, or either the exposed or unexposed areas may be chemically treated. The chemistry of photoimaging processes is well-known, and any one of the conventional routes is acceptable to arrive at a circuit pattern on the substrate.

A typical apparatus currently employed in the photoimaging processes described above generally comprises a pair of glass or transparent plastic frames defining an enclosed space which can be evacuated. Typically, a pair of struts, rods or pivots employing gas or hydraulics, are used to assist in opening, holding open, and closing the upper and lower frames. U.S. Pat. No. 5,072,257 to Stoesser, U.S. Pat. No. 4,600,298 to Emmert and U.S. Pat. No. 4,896,188 to Byers describe typical strut, rod and pivot devices. A pair of flexible photoimaging masters may be visually aligned and then manually secured individually to the frame members by such devices as vacuum, tape, clamps or spring clips. However, glass photoimaging assemblies are typically registered using cylindrical alignment pins fitted through holes drilled through corresponding areas of the glass plates.

A photopolymer coated substrate is then precisely registered between the frame members. Different thicknesses of substrates, especially thick or dual substrates, may affect the registration of the materials. The apparatus is subjected to vacuum and exposed to actinic radiation. When the substrate is removed from the apparatus to develop the circuit pattern, the top glass plate must be lifted, held in place by support means such as struts, rods or pivots to replace or check the substrate. The struts, rods or pivots hold the top frame in place, allowing the operator to easily change substrates or check registration. However, the constant lifting, holding in place and closing by the support means places a great deal of stress upon the lower glass frames since the load carried by the support means in holding the upper frame is transferred to the lower frame which causes the lower frame to deflect or bend. Typically, the most common type of repair work for photoimaging devices involves replacing or repairing the lower frame which has cracked or has broken due to stresses incurred by repeated openings and closings, Common breakages, especially for the widely used glass frames, involve hairline fractures down the center or skewed slightly off center of the lower frame.

In addition, should the thicknesses of substrates vary, the device must be manually shimmed up or down which may involve deconstructing a complicated hinge structure or even removing a hinge which may be bonded by an adhesive to the glass. This process is also difficult, time-consuming and inaccurate, with the glass exposed to high risk of breakage, and the hinge is compromised by repeated shimming, and lifting and closing. The present invention has no mechanical or wearing parts. Another option is to keep multiple photoimaging devices with each one having the ability to accommodate a different thickness of substrate. However, this is an expensive and impractical option, especially for smaller companies involved in the printed circuit industry. Others have attempted to create flexible hinges which can accommodate differing substrate thicknesses. U.S. Pat. No. 4,412,739 to Freiberg, U.S. Pat. No. 4,446,184 to Bowser, and U.S. Pat. No. 4,584,216 to Kenworthy describe typical flexible hinges.

The present invention provides an improved photoimaging apparatus which improves reliability by using a reinforcing hinge to counteract stresses caused in the frame members by support mechanisms such as struts and pivots, retains the inherent flexibility of the polymeric hinge material and provides a greater range of adjustability and serviceability of the photoimaging apparatus without compromising precise registration. The present invention, resistant to breakages common of other photoimaging assemblies, combines the inherent flexibility of a polymeric hinge with the ability for the user to easily adjust the photoimaging device with spacers of varying thicknesses to accommodate varying thicknesses of substrates and also allows the user to easily service and maintain the assembly which has no mechanical or wearing parts.

SUMMARY OF THE INVENTION

The present invention encompasses a method for making a hinged photoimaging apparatus by joining two rigid plates, by means of an reinforcing, adjustable, serviceable hinge. The present invention encompasses a hinged photoimaging apparatus comprising two transparent plates and a reinforcing, adjustable, serviceable hinge assembly, which provides reinforcement against breakages of the plates and also allows the user to easily accommodate different thicknesses of substrates and to easily replace and service parts of the hinge without discarding the entire photoimaging apparatus.

DESCRIPTION OF THE PREFERRED EMBODIMENTS

Figure 1:
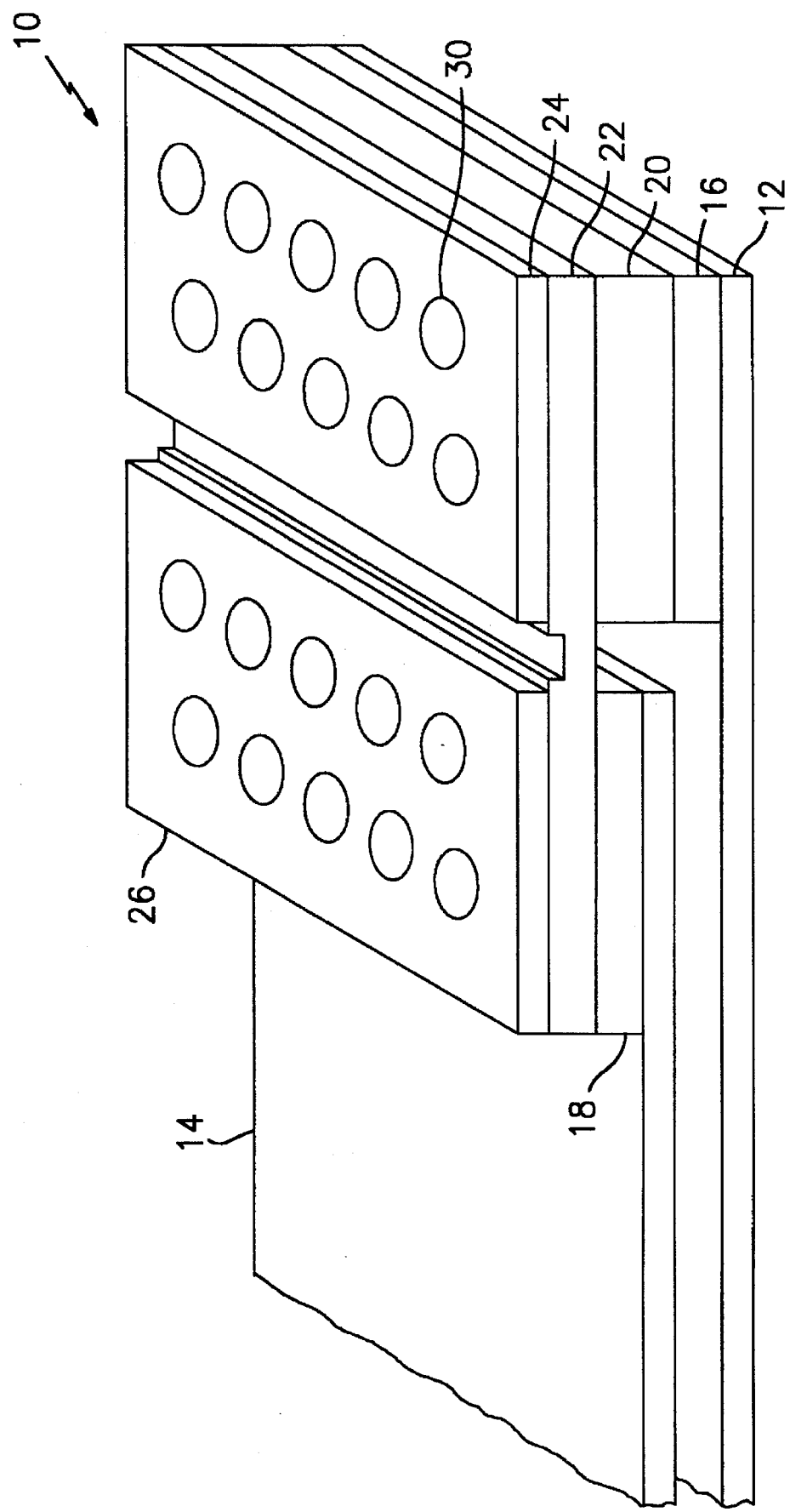
FIG. 1 shows in perspective a hinged photoimaging apparatus 10 wherein a pair of rigid plates 12 and 14 are joined by an adjustable serviceable hinge means which includes a pair of hinge plates 16 and 18 having a plurality of threaded studs 17 and 19 respectively, hinge plates 16 and 18 which are attached to the rigid plates 12 and 14 respectively, a spacer plate 20 of varying widths which is further attached to hinge plate 16, a flexible polymeric hinge 22, which is affixed by retaining plates 24 and 26 by screws 30.

The present invention provides for improved reliability, easy and simple maintenance, and flexibility of a photoimaging apparatus while maintaining efficient and accurate repeated use of a photoimaging apparatus comprising a pair of transparent rigid plates joined by a reinforcing, adjustable, user serviceable polymeric and metal hinge. Referring to FIG. 1, photoimaging apparatus 10 of the present invention preferably includes a lower rigid plate 12 and an upper rigid plate 14, at least one of which comprises a photoimaging image (not shown), and a hinge assembly. The assembly preferably also comprises a pair of hinge plates 16 and 18, a lower hinge plate 16 which is bonded to lower rigid plate 12 and an upper hinge plate 18 which is bonded to the upper rigid plate 14, a spacer plate 20 of varying widths which is placed between lower hinge plate 16 and a flexible polymeric hinge 22, which joins rigid plates 12 and 14 and is affixed by retaining plates 24 and 26 using screws 30.

The spacer plate 20 will be of various thicknesses and will be made of any rigid, noncompressible material like metal or higher density plastic. The different spacer plates may be substituted to accommodate circuit board substrates of various thicknesses in a flush overlying relationship between the first member and second member.

Figure 5:
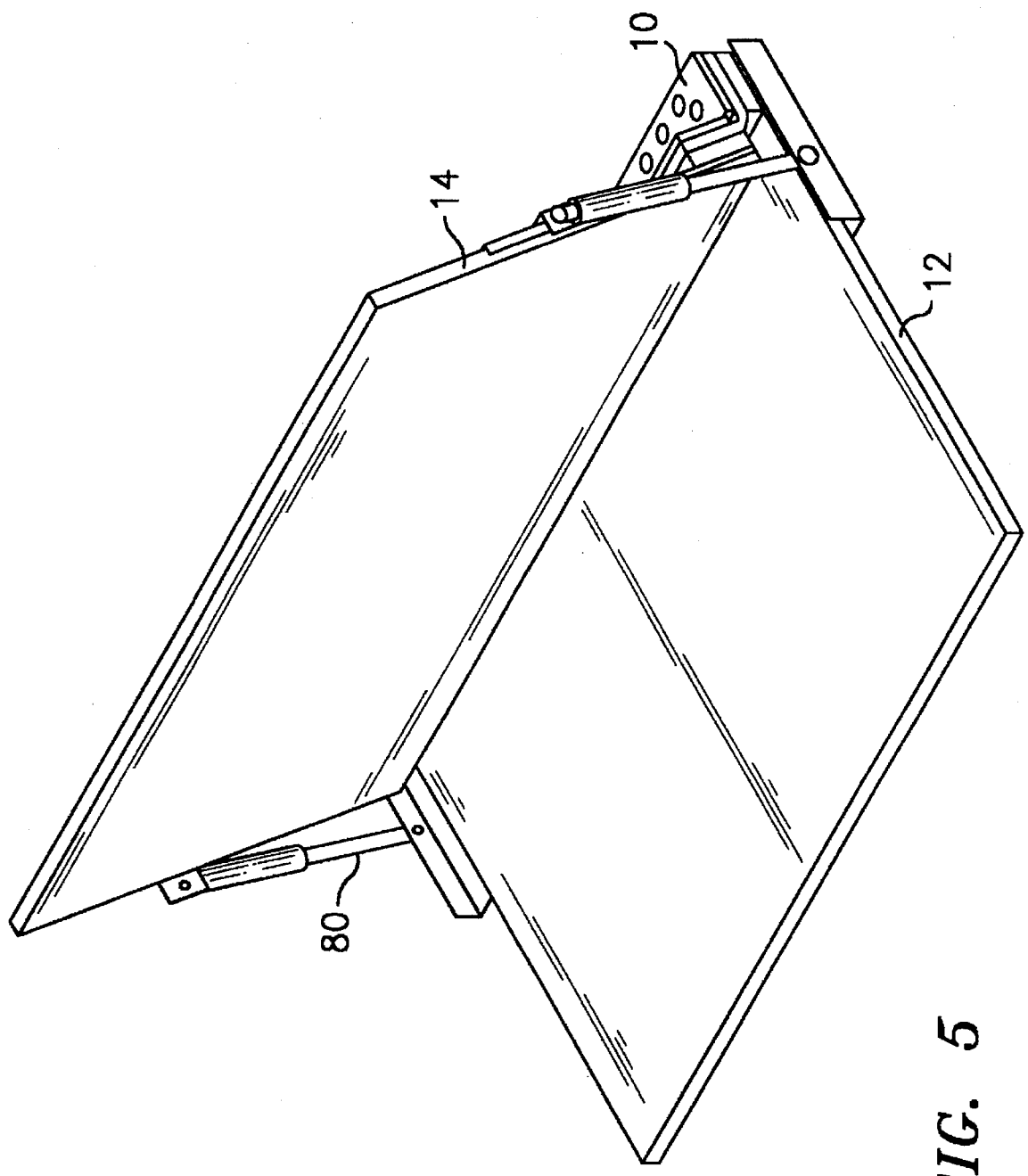
FIG. 5 is a perspective view to show the hinge flexed in an open position, held by support means 80.
Figure 6:
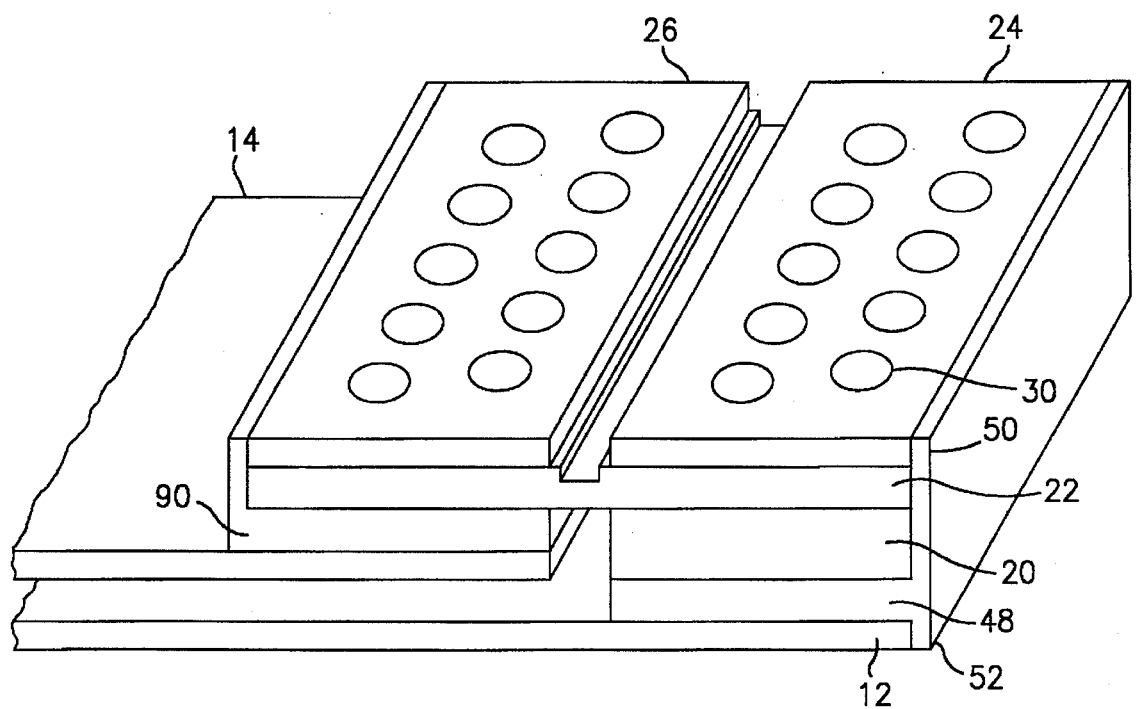
FIG. 6 shows in perspective a hinged photoimaging apparatus 10 with an "T" shaped reinforcing bottom hinge plate 48 and an "L" shaped reinforcing top hinge plate 90.
Figure 7:
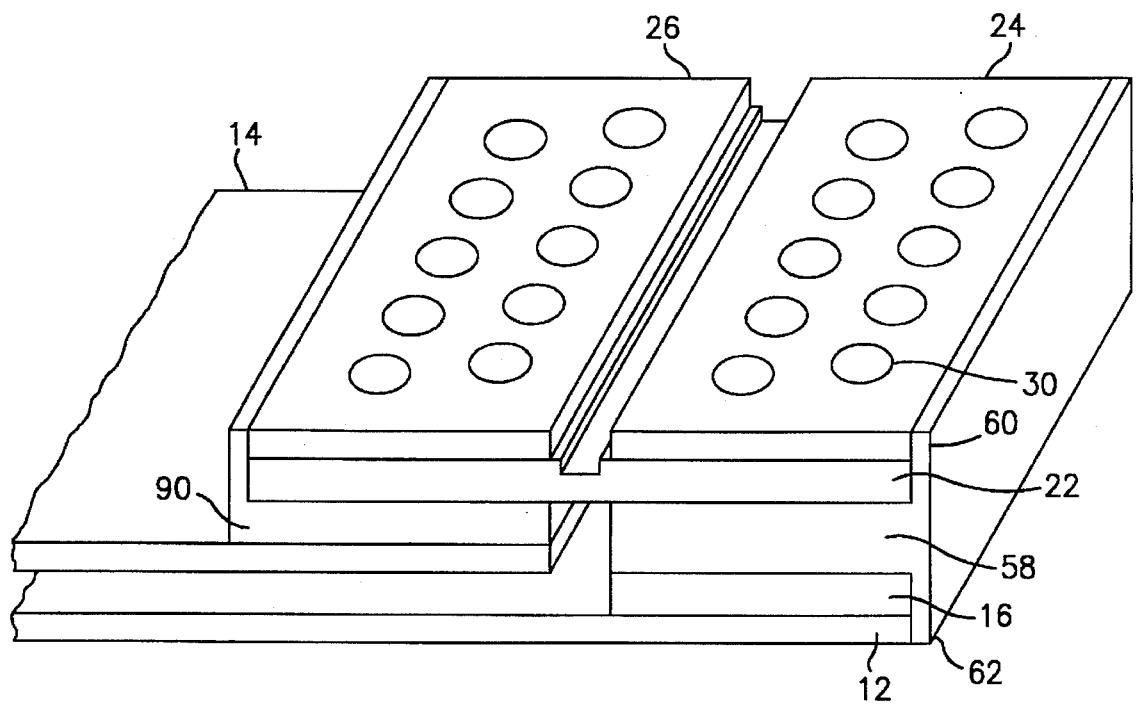
FIG. 7 shows in perspective a hinged photoimaging apparatus 10 with an "T" shaped reinforcing spacer plate 58 and an "L" shaped reinforcing top hinge plate 90.
Figure 8:
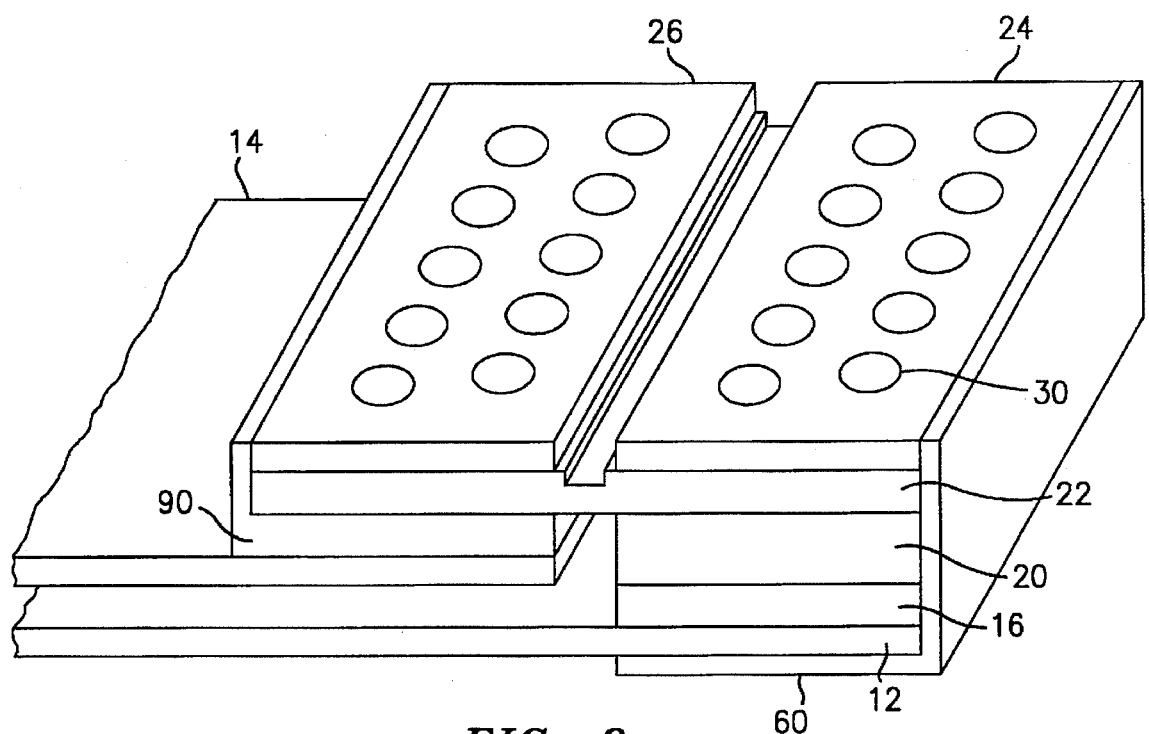
FIG. 8 shows in perspective a hinged photoimaging apparatus 10 with an "L" shaped external reinforcing plate 60 and an "L" shaped reinforcing top hinge plate 90.

Two rigid plates 12 and 14 are preferably joined by a flexible hinge means comprising hinge plates 16 and 18, spacer plate 20, polymeric hinge 22, and retaining plates 24 and 26. In one version of the preferred embodiment as shown more clearly in FIG. 6, the T-shaped bottom hinge plate 48 has two flanges, 50 and 52 which when adhesively bonded to the layers of the hinge means 10, reduces flexure and stress caused by support means 80, as shown in FIG. 5, which can cause breakage in the lower glass plate 12. The invention further includes an L-shaped top hinge plate 90 as shown in FIGS. 6, 7 and 8 which when adhesively bonded to the top hinge layers, reinforces the top hinge means 10.

Figure 2:
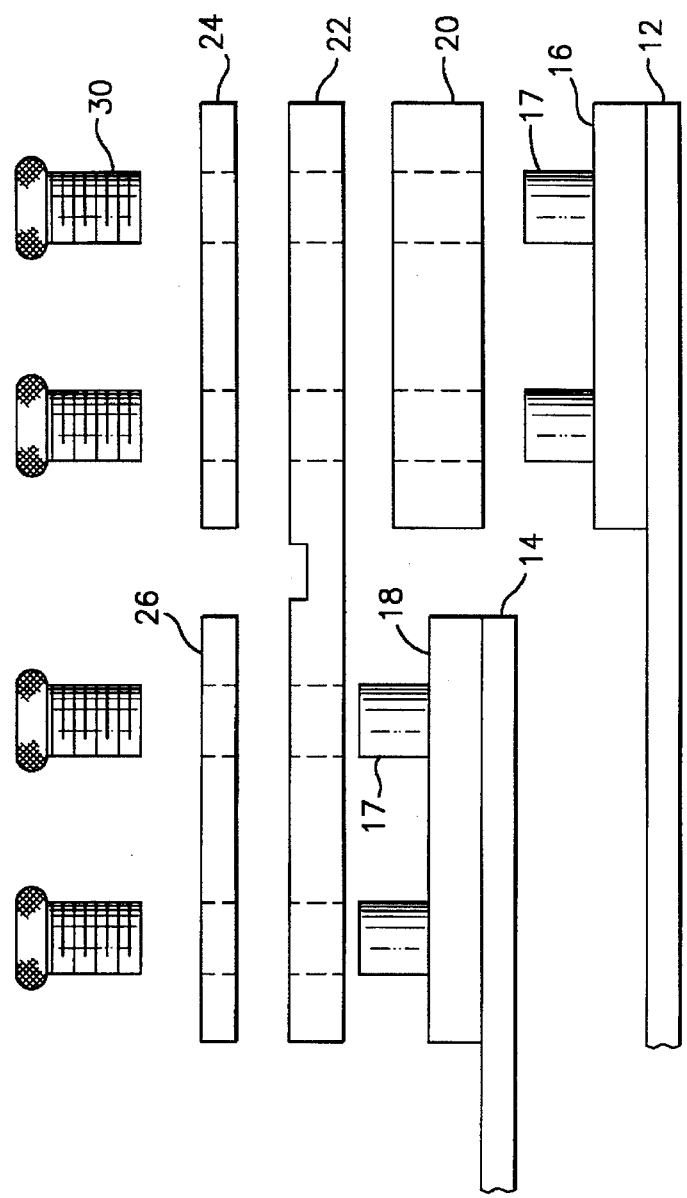
FIG. 2 is a partial end view, enlarged to illustrate the multi-layer cross-section of the hinge means comprised of rigid plates 12 and 14, hinge plates 16 and 18, spacer plate 20, polymeric hinge 22, retaining plates 24 and 26 and screw 30.
Figure 3:
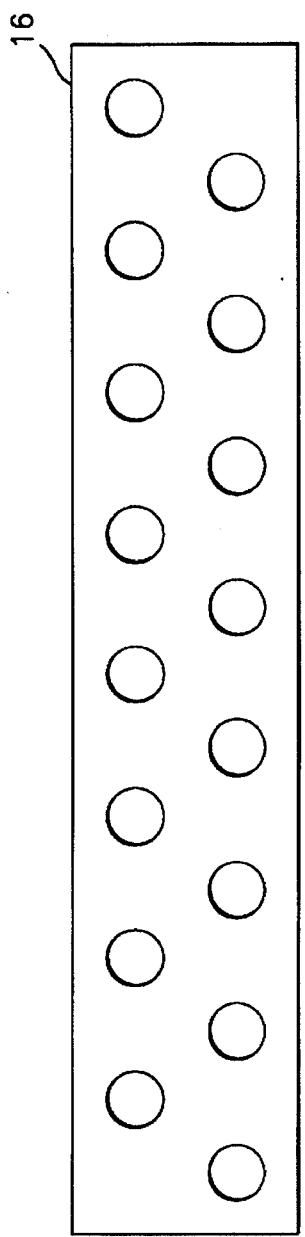
FIG. 3 is a partial top view of an hinge plates 16 and 18 to show the staggered configuration of threaded studs 17.

In accordance with the present invention, the invention further comprises a spacer plate 20 of varying widths which can be easily replaced by the user simply by screwing and unscrewing screws 30. The size of the spacer plate to be used is determined by the size of the substrates to be processed. Furthermore, in another version of the preferred embodiment as more clearly shown in FIG. 7, the T-shaped spacer may have two flanges 60 and 62, which when adhesively bonded to the layers of the hinge means 10, acts to decrease the amount of flexure and stress in the lower rigid plate 12 so as to reduce the incidences of breakage, especially in rigid plates constructed of glass. As depicted in FIG. 2, in a preferred embodiment of the hinge means 10, the flexible hinge 22, spacer plate 20, retaining plates 24 and 26, and screws 30 may all be replaced as needed due to wear without the need for replacing the entire photoimaging apparatus or disturbing hinge plates 16 and 18. Referring to FIG. 3, in a preferred embodiment of the hinge means 10, the threaded studs 17 of 19 of hinge plates 16 and 18 and the corresponding holes in spacer plate 20, polymeric hinge 22, and retaining plates 24 and 26 are arranged in a staggered format to allow for maximum strength along the entire length of the hinge and to reduce any movement of the hinge which may affect registration.

Figure 4:
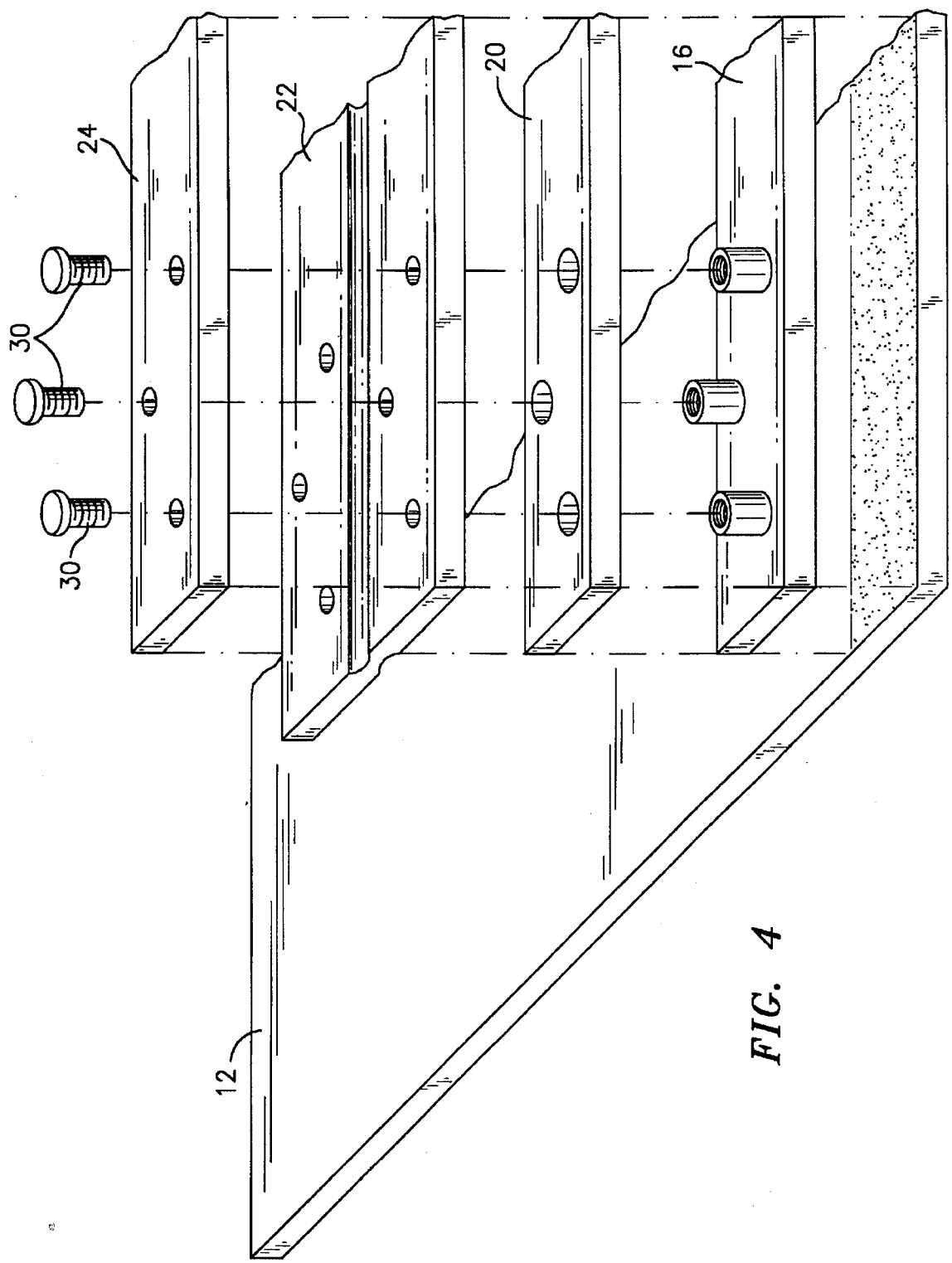
FIG. 4 is a partial perspective view to show how the multi-layers of hinge assembly 10 fit together.

In a preferred practice of the present invention, a clean plate is preferably placed in a horizontal position on a supporting fixture. As shown in FIG. 4, two hinge plates 16 and 18, narrow strips of metal with threaded studs 17 and 19 protruding outward, is attached to both glass plates 12 and 14 using a suitable adhesive. A spacer plate 20 of varying thicknesses is then place on one of the hinge plates. A strip of flexible polymeric hinge 22 material is then attached to both hinge plates 16 and 18 to join the glass plates 12 and 14. The flexible hinge material 22 is then secured by means of two retaining plates 24 and 26 and screws 30 which are preferably headed type screws.

Preferred flexible polymer hinge materials are preshaped to the hinge configuration of the present invention and attached to the hinge plates and spacer to form a very flexible and adjustable hinge as shown in FIG. 5, the movement of the hinge aided by support means 80.

In a further modification of the preferred embodiment as shown in FIG. 8, the reinforcement of the hinge assembly 10, may be accomplished through an external plate 60, which when adhesively bonded to the layers of the hinge means 10 and the bottom of glass plate 12, reduces flexure and breakage in the lower glass plate 12.

Changes may be made in the construction and the operation of the various components and the assemblies described herein and changes may be made in the steps or sequence of steps of the methods described herein without departing from the spirit and scope of the invention as defined in the following claims.

We claim:

1. In a method for making a hinged photoimaging apparatus by joining an upper rigid plate and a lower rigid plate by means of a reinforcing adjustable serviceable hinge assembly which comprises:

attaching an upper hinge plate having a plurality of staggered threaded studs to said upper rigid plate by means of an adhesive;

attaching a lower hinge plate having a plurality of staggered threaded studs to said lower rigid plate by means of an adhesive;

attaching a spacer plate having a plurality of staggered openings to accommodate said threaded studs to said lower hinge plate;

attaching a flexible polymeric hinge having a plurality of staggered openings to accommodate said threaded studs to each of said two hinge plates;

attaching an upper retaining plate having a plurality of staggered openings to accommodate said threaded studs to said upper hinge plate;

attaching a lower retaining plate having a plurality of staggered openings to accommodate said threaded studs to said lower hinge plate; and fastening said retaining plates with a plurality of threaded screws to said threaded studs.

2. The method according to claim 1, wherein the upper and lower rigid plates are glass.

3. The method according to claim 1, wherein the upper and lower rigid plates are plastic.

4. The method according to claim 1, further comprising the step of attaching a spacer plate of varying thicknesses interposed between said lower hinge plate and said polymeric hinge.

5. The method according to claim 1, further comprising the step of attaching an external reinforcing plate to said hinge assembly by means of an adhesive.

6. A hinged photoimaging apparatus comprising:

an upper rigid plate;

a lower rigid plate;

an upper hinge plate having a plurality of staggered threaded studs fixedly attached to said upper rigid plate, each stud having one end connected to the upper hinge plate and each stud extending a distance from said upper hinge plate and terminating with an opposite open end;

a lower hinge plate having a plurality of staggered threaded studs fixedly attached to lower rigid plate, each stud having one end connected to said lower hinge plate and each stud extending a distance from said lower hinge plate and terminating with an opposite open end, said hinge plate is "T" shaped, a portion of which is adhesively attached to said lower rigid plate so as to reduce flexing is said lower rigid plate;

a spacer plate having a plurality of staggered openings extending through with, each opening having a diameter about the same as the diameter of said threaded studs and the openings being sized to receive a portion of said threaded studs extending therethrough, said spacer plate attached to said lower hinge plate through the interference fit being established between each opening on said spacer plate and said threaded studs of said lower hinge;

a flexible polymeric hinge having a plurality of staggered openings, each opening having a diameter about the same as said diameter of said threaded studs and the openings being sized to receive a portion of said threaded studs extending therethrough, and an interference fit being established between each opening of said hinge and said threaded studs of said upper and lower hinge plates, said polymeric hinge having a top and bottom side, said top side having a groove extending down the entire length of the center of said hinge, said top further having a left and right side separated by said groove, said hinge joining said upper and lower hinge plates;

an upper retaining plate having a plurality of staggered openings to accommodate said threaded studs to said upper hinge plate, each opening having a diameter about the same as the diameter of said threaded studs and the openings being sized to receive a portion of said threaded studs extending therethrough, and an interference fit being established between each opening of said upper retaining plate and said threaded studs of said upper hinge plate, said retaining plate positioned on said top left side of said polymeric hinge;

a lower retaining plate having a plurality of staggered openings to accommodate said threaded studs to said lower hinge plate, each opening having a diameter about the same as the diameter of said threaded studs and the openings being sized to receive a portion of said threaded studs extending therethrough, and an interference fit being established between each opening of said lower retaining plate and said threaded studs of said lower hinge plate, said retaining plate positioned on said top right side of said polymeric hinge; and a plurality of threaded screws, adjustably threaded into said open ended studs for securing together said hinge assembly.

7. A hinged photoimaging apparatus comprising:

an upper rigid plate;

a lower rigid plate;

an upper hinge plate having a plurality of staggered threaded studs fixedly attached to said upper rigid plate, each stud having one end connected to the upper hinge plate and each stud extending a distance from said upper hinge plate terminating with an opposite open end;

a lower hinge plate having a plurality of staggered threaded studs fixedly attached to said lower rigid plate, each stud having one end connected to the lower hinge plate and each stud extending a distance from lower hinge plate terminating with an opposite open end;

a spacer plate having a plurality of staggered openings extending throughwith, each opening having a diameter about the same as the diameter of said threaded studs and the openings being sized to receive a portion of said threaded studs extending therethrough, said spacer plate attached to said lower hinge plate through an interference fit being established between each opening on said spacer plate and said threaded studs of said lower hinge plate;

a flexible polymeric hinge having a plurality of staggered openings, each opening having a diameter about the same as the diameter of said threaded studs and the openings being sized to receive a portion of said threaded studs extending therethrough, and an interference fit being established between each opening of said hinge and said threaded studs of said upper and lower hinge plates, said polymeric hinge having a top and bottom side, said top side having a groove extending down the entire length of the center of said hinge, said top further having a left side and a right side separated by said groove, said hinge joining said upper and lower hinge plates, an upper retaining plate having a plurality of staggered openings to accommodate said threaded studs to said upper hinge plate, each opening having a diameter about the same as the diameter of said threaded studs and the openings being sized to receive a portion of said threaded studs extending therethrough, and an interference fit being established between each opening of said upper retaining plate and said threaded studs of said upper hinge plate, said retaining plate positioned on said top left side of said polymeric hinge;

a lower retaining plate having a plurality of staggered openings to accommodate said threaded studs to said lower hinge plate, each opening having a diameter about the same as the diameter of said threaded studs and the openings being sized to receive a portion of said threaded studs extending therethrough, and an interference fit being established between each opening of said lower retaining plate and said threaded studs of said lower hinge plate, said retaining plate positioned on said top right side of said polymeric hinge;

a plurality of threaded screws, adjustably threaded into said open ended studs for securing together said hinge assembly.

8. An article according to claim 7, wherein said upper hinge plate is an "L" shape, said "L" shaped hinge plate bonded to said hinge means so as to have the result of reducing flex in said upper rigid plate.

9. An article according to claim 7, wherein said lower hinge plate is an "L" shape, said "L" shaped hinge plate bonded to said hinge means so as to have the result of reducing flex in said lower rigid plate.

10. An article according to claim 7, wherein said spacer plate is a "T" shape, said spacer plate having a pair of flanges extending perpendicularly outward from said spacer plate, said flanges bonded to said hinge means so as to have the result of reducing flex in said lower rigid plate.

11. An article according to claim 7, further comprising an external "L" shaped reinforcing plate, adhesively attached to said hinge assembly so as to reduce flex in the lower rigid plate.

12. An article according to claim 7, wherein said plates are in parallel spaced facing relation and said hinge is attached along the entire length of one pair of parallel adjacent edges of said plates perpendicular to the facing surfaces of said plates.

13. An article according to claim 7, wherein said plates are coplanar with adjacent edges in parallel spaced relation and said hinge is attached along the entire length to adjacent parallel facing edge surface portions of the plates.

14. The article according to claim 7, wherein the two rigid plates are glass.

15. The article according to claim 7, wherein the two rigid plates are plastic.

* * * * *